(12) United States Patent
Rabii

(10) Patent No.: US 6,469,547 B1
(45) Date of Patent: Oct. 22, 2002

(54) OFFSET WINDOW DETECTOR

(75) Inventor: Shahriar Rabii, Stanford, CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/209,140

(22) Filed: Dec. 10, 1998

(51) Int. Cl.⁷ .............................................. H03K 5/24
(52) U.S. Cl. ............................. 327/74; 327/72; 327/58; 327/62
(58) Field of Search .............................. 327/72, 74, 50, 327/75, 76, 77, 78, 79, 62, 63, 58, 69, 60

(56) References Cited

U.S. PATENT DOCUMENTS

| | | | |
|---|---|---|---|
| 4,503,340 A | | 3/1985 | Linder .......................... 307/360 |
| 4,543,498 A | | 9/1985 | Gorecki ....................... 307/360 |
| 5,488,323 A | * | 1/1996 | Beacham, Jr. et al. ........ 327/74 |
| 5,557,228 A | * | 9/1996 | Araya et al. .................. 327/28 |
| 5,856,750 A | * | 1/1999 | Koseki ......................... 327/75 |
| 5,903,220 A | * | 5/1999 | Jon et al. ..................... 340/600 |
| 5,933,459 A | * | 8/1999 | Saunders et al. ............. 327/74 |
| 6,215,335 B1 | * | 4/2001 | Rabii .......................... 327/74 |

OTHER PUBLICATIONS

IBM Technial Disclosure Bulletin, Apr. 1986, vol. 28, Issue No. 11, pp. 4969–4970.*

* cited by examiner

Primary Examiner—Dinh T. Le
(74) Attorney, Agent, or Firm—Merchant & Gould P.C.

(57) ABSTRACT

An offset window detector that senses the sum of two signals and compares the result to a reference voltage for attenuating an offset voltage and producing a desired gain. The primary design issues of the detector is to achieve a very low voltage offset and a low power dissipation. The detector is part of the offset circuits in the I/Q path of a wireless receiver. The maximum input signal and the minimum input signal are the positive and negative peak values of the in-phase or the quadrature signal paths. They are generated by a peak detector. The offset signal can be estimated by the addition of the maximum input signal with the minimum input signal. This resulting offset signal is compared to the reference voltage to determine if the resulting signal is greater than a maximum reference voltage, less than a minimum reference voltage or within the maximum and minimum voltages. A reference voltage generator creates the desired voltages within a desired tolerance.

39 Claims, 6 Drawing Sheets

OFFSET WINDOW DETECTOR

BACKGROUND OF THE INVENTION

1. Field of the Invention

This invention relates in general to an offset window detector, and more particularly to an offset window detector that determines whether a summation of input signals falls within a window.

2. Description of Related Art

Today's wireless communications markets are being driven by a multitude of user benefits. Products such as cellular phones, cordless phones, pagers, and the like have freed corporate and individual users from their desks and homes and are driving the demand for additional equipment and systems to increase their utility. As a result digital radio personal communications devices will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include data converters, comparators, demodulators, filters, amplifiers and voltage regulators.

One important aspect of digital radio personal communications devices is the integration of the RF sections of transceivers. Compared to other types of integrated circuits, the level of integration in the RF sections of transceivers is still relatively low. Considerations of power dissipation, low offset budgets, form factor, and cost dictate that the RF/IF portions of these devices evolve to higher levels of integration than is true at present. Nevertheless, there are some key barriers to realizing these higher levels of integration.

For example, most applications provide a comparator circuit in an RF receiver system to compare different signals. For offset window detectors, input signals are compared to a reference voltage and a resulting signal is used to control an offset integrator. The offset window detector with hysteresis is used to detect when the offset in a circuit has settled out and to direct the integrators to hold their acquired offset. However, the information received from the offset window detector controls the integrators to maintain a voltage level predetermined in a hysteresis window. Therefore, the offset window detector determines parameters such as: signal level budget, minimum gain step size, amplifier voltage limits, speed of input level variations due to multi-path fading and demodulator dynamic range. Input signal level regulation is critical for these components. To provide this regulation, the window detector implements circuitry which compares an signal to the reference voltage. A reference voltage source generates a reference voltage window that is used to determine if a resulting input signal is less than, greater than, or equal to the reference voltage.

It can be seen then that there is a need for an offset window detector to determine whether the summation of input signals falls within a window.

It can also be seen that there is a need for an offset window detector that senses input signals and drives digital circuits in response thereto to produce the desired gain and to attenuate the offset voltages.

SUMMARY OF THE INVENTION

To overcome the limitations in the prior art described above, and to overcome other limitations that will become apparent upon reading and understanding the present specification, the present invention discloses an offset window detector circuit that determines whether a summation of input signals falls within a window.

The present invention solves the above-described problems by providing an offset window detector that determines whether the summation of input signals falls within a window and drives digital circuits in response thereto to produce the desired gain and to attenuate the offset voltages.

A system in accordance with the principles of the present invention includes comparing an input signal to a first reference voltage to produce a first output signal and comparing the input signal to a second reference voltage to produce a second output signal, wherein the first and the second output signal indicates whether the input signal is within a reference window defined by the first and the second reference voltages.

Other embodiments of a system in accordance with the principles of the invention may include alternative or optional additional aspects. One such aspect of the present invention further includes summing the value of the input signal.

Another aspect of the present invention is that the summing of the value of input signal further includes summing a maximum input signal value with a minimum input signal value resulting in a cumulative input signal value.

Another aspect of the present invention is that the summing of the value of input signal further includes summing an in-phase minimum signal with an in-phase maximum signal and a quadrature minimum signal with a quadrature maximum signal.

Another aspect of the present invention is that the summing of the value of input signal further includes sampling the input signal.

Another aspect of the present invention is that the input signal further includes computing an addition and a subtraction of the input minimum signal with the input maximum signal to determine a polarity of a resulting signal.

Another aspect of the present invention is that the subtraction of the input minimum signal with the input maximum signal further includes reversing the polarity of the positive and negative components of the input signal.

Another aspect of the present invention is that the computing of the addition and the subtraction further includes sampling the input signal via a parasitic insensitive sampling network.

Another aspect of the present invention is that the parasitic insensitive sampling further includes accomplishing the addition and the subtraction by a charge sharing of parallel capacitors.

Another aspect of the present invention is that the sampling of the input signal further includes preamplifying a low level signal.

Another aspect of the present invention is that the sampling of the input signal further includes latching a voltage level.

Another aspect of the present invention is that the sampling of the input signal further includes generating two nominally identical voltages to reduce cross talk between a first preamplifier signal and a second preamplifier signal.

Another aspect of the present invention is that the method further includes providing a reference voltage.

Another aspect of the present invention is that the providing of the reference voltage further includes generating all needed reference voltages from a single source.

Another aspect of the present invention is that the reference voltage further includes providing a control signal to regulate the reference voltage wherein the control signal varies a hysteresis window.

Another aspect of the present invention is that the offset window detector further includes an architecture which utilizes a minimal number of circuits to perform the detection function.

Another aspect of the present invention is that the offset window detector further includes producing the output to drive digital circuitry to achieve the desired gain and the attenuation of offset voltages.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The primary design issues of a window comparator such as the offset window detector is to achieve a very low voltage offset and a low power dissipation. The window detector is part of the offset circuits in the I/Q path of a wireless receiver. The maximum and minimum input signals, $V_{max}+V_{min}$ respectively, are a positive and a negative peak value a of an in-phase or a quadrature signal path, also referred to as a differential signal. The input signals are generated by a peak detector. Thus, the offset is equal to $$\frac{V_{max} + V_{min}}{2}$$

The maximum input signal is added to a the minimum input signal by the detector and compared to the reference voltage to determine if the resulting signal is greater than a maximum reference voltage, less than a minimum reference voltage or within the maximum and minimum voltages.

In a transceiver system, the transmitter and receiver are never on simultaneously. In operation, data is bursted by the RF transmitter at more than twice the rate of the continuous input data to be transmitted for less than half the time. The far end receiver stores up the bursted data to be read out of a memory at a slower continuous pace. The RF receiver, however, typically introduces DC offset voltages. The offset window detector senses the input signal to assist in the cancellation of these offset voltages. The offset window comparator output, in conjunction with an AGC window comparator output, drive the digital logic circuits that ultimately serve to acquire the desired gain and attenuate offsets in a system.

Figure 1:
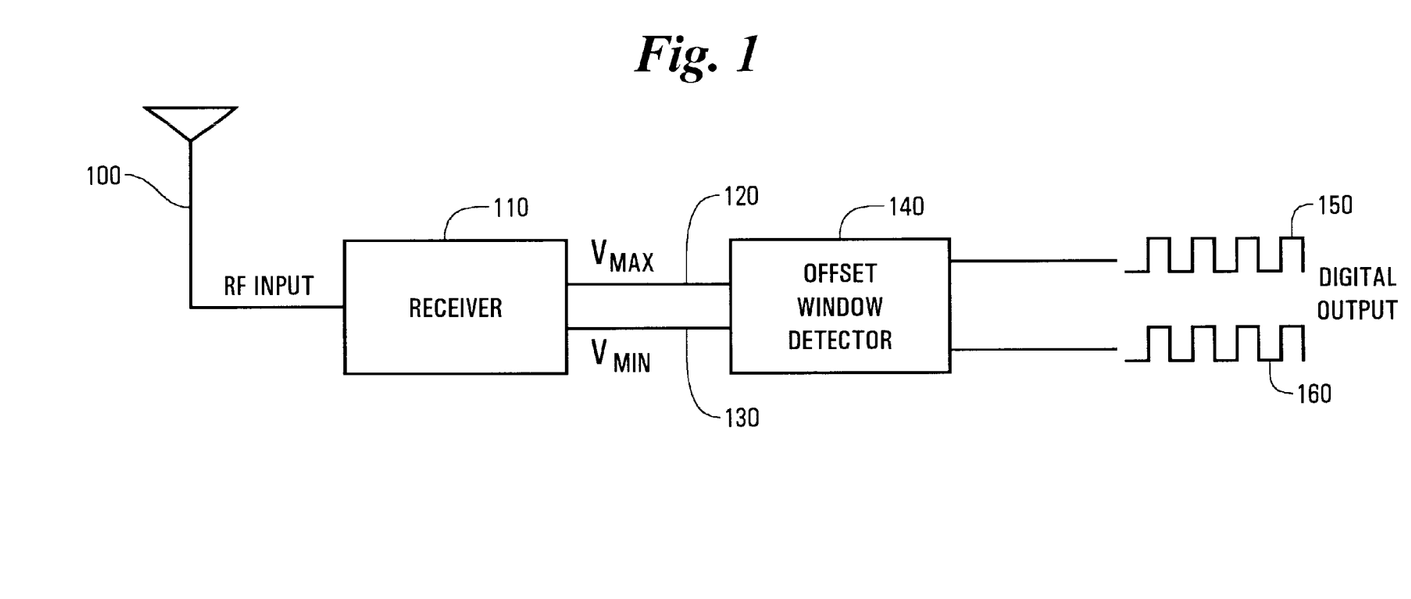
FIG. 1 is an exemplary diagram showing the offset window detector in a typical radio receiver system.

FIG. 1 is an exemplary diagram showing the offset window detector in a typical radio receiver system. An RF signal is received by an antenna 100 and is routed into receiver system 110. The outputs from peak detectors embedded in the receiver system are the input signals to the offset window detector 140. The input signals comprise the maximum input ($V_{max}$) signal 120 and the minimum input ($V_{min}$) signal 130. The detector's output is a two bit digital data waveform 150, 160 capable of providing three values, whether the sum of the two inputs is less than the window defined by the references, within this window, or greater than a window.

Figure 2:
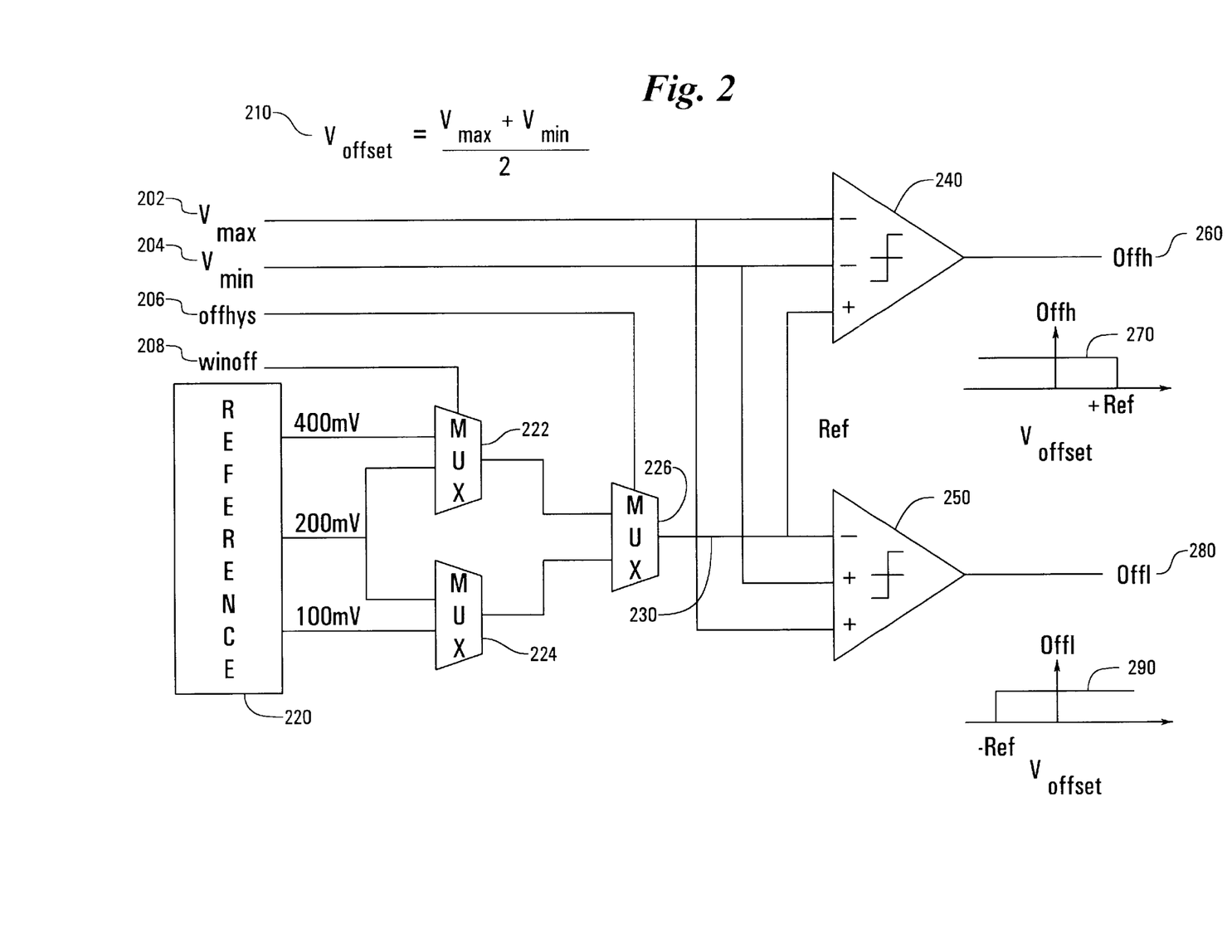
FIG. 2 is a block diagram of an offset window detector circuit.

FIG. 2 is a block diagram of an offset window detector. The comparators 240, 250 are capable of addition and subtraction of three differential analog voltages simultaneously and determining the polarity of a resulting voltage. The addition of the maximum input voltage ($V_{max}$) 202 and the minimum input voltage ($V_{min}$) 204, equals two times the offset voltage (2* $V_{offset}$). The input voltages $V_{max}$ 202, $V_{min}$ 204 and a reference voltage (Ref) 230 are inputs to a first comparator 240 and a second comparator 250. The input voltages $V_{max}$ 202, $V_{min}$ 204 are connected to the negative terminals of the first comparator and the reference voltage (Ref) 230 is connected to the positive terminal of the first comparator 240. The input voltages $V_{max}$ 202, $V_{min}$ 204 are connected to the positive terminals of the second comparator and the reference voltage (Ref) 230 is connected to the negative terminal of the second comparator 250. The comparators sample the voltages via a parasitic insensitive sampling network via capacitors during phase one of the clock cycle.

During phase 2 of the clock cycle the capacitor is placed in parallel and the addition and subtraction operations are accomplished by charge sharing. The polarity of an input can be reversed by tying its positive component to a negative side of the comparators sampling network and its negative component to a positive side of the sampling network. Thereby subtraction can be accomplished as easily as addition.

The input signals $V_{max}$ 202 and $V_{min}$ 204 are added together, scaled by a factor of ½ and compared to the reference voltage 230 to produce a two bit digital signal, a high level offset indicator (offh) 260 and a low level offset indicator (offl) 280, with three possible values. An inset graph of offh 270 versus $V_{offset}$ 270 depict when a positive reference voltage (Ref) is greater then $V_{offset}$, the output 260 will go high. The inset graph of offl 280 versus $V_{offset}$ 270 depict when a negative reference voltage (–Ref) is less then $V_{offset}$, the output 280 will go high. The combination of offh 260 and offl 280 will produce the two bit output which can take three possible states indicating whether the offset signal level is above Ref, below –Ref, or within the window created by Ref and –Ref voltages.

The reference voltage generator 220 creates the desired voltages, e.g., using a bandgap generated current and polysilicon resistors. The system can tolerate a plus or minus 5% error in reference voltages without significant performance degradation. A reference voltage generator output is selected with the control signals offhys 206 and winoff 208. The control signals offfhys 206 and winoff 208 control multiplexors 222, 224, 226 that select the output provided by the reference voltage generator 220. These signals allow a change in the signal level by varying an offset hysteresis window.

Figure 3:
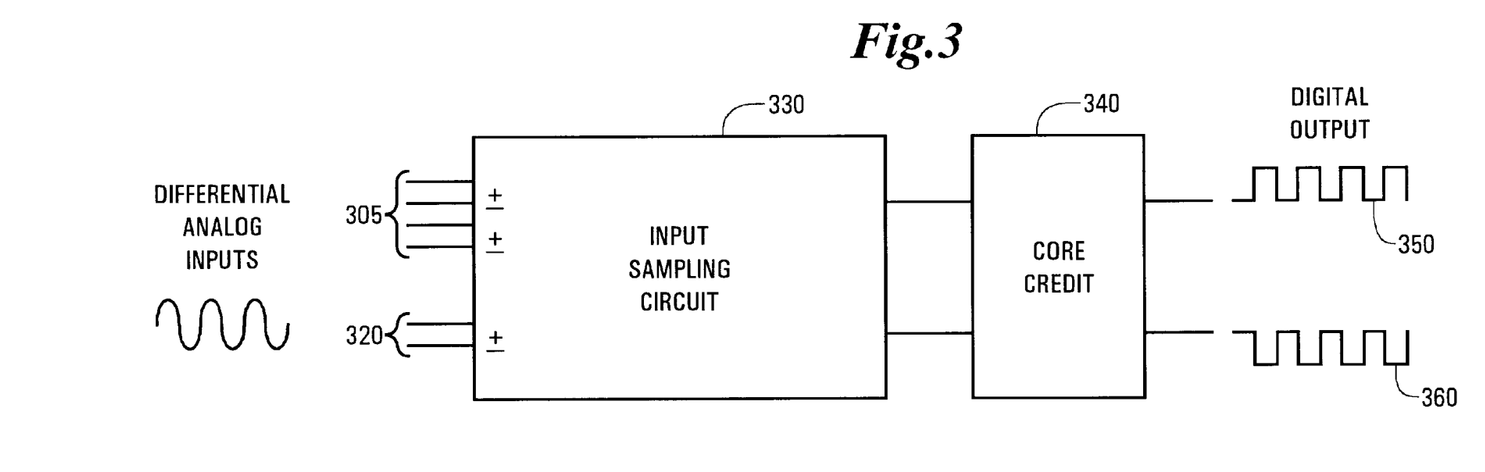
FIG. 3 is a block diagram of an offset window detector input sampling network.

FIG. 3 is a block diagram of an offset window detector input sampling network. The input sampling circuit 330 can compare up to two differential analog voltages 305 simultaneously with the reference voltage 320. The resulting signal is transmitted to the core circuit 340 resulting in a positive 350 and negative 360 output digital signal. The core circuit 340 consists of a minimum number of subcircuits necessary to support the functionality previously described. These subcircuits include an output offset canceled preamplifier, an input offset canceled preamplifier, a regenerative latch, a set-reset latch and biasing circuit.

Figure 4:
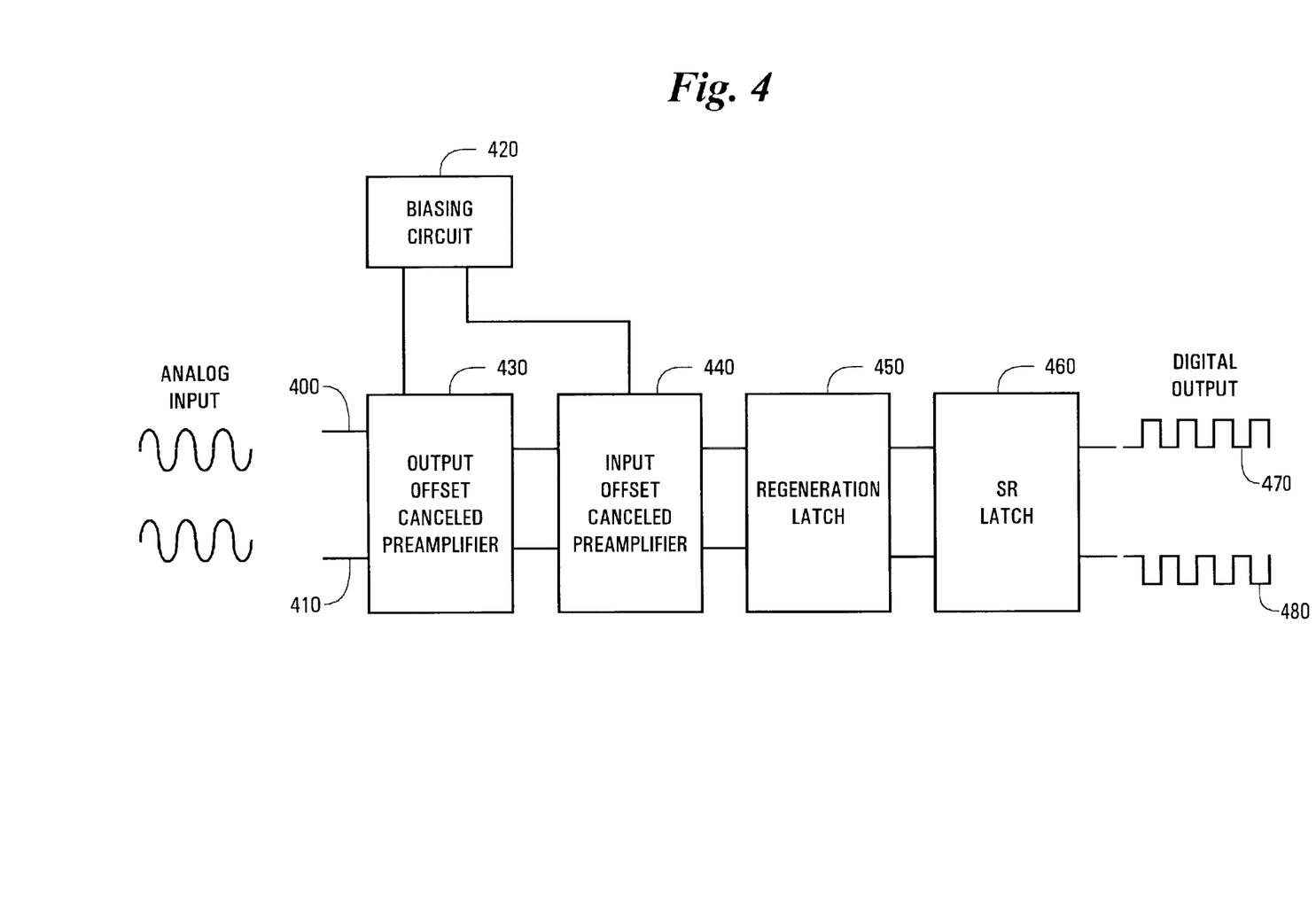
FIG. 4 is a block diagram. of an offset window detector core circuits.

FIG. 4 is a block diagram of an offset window detector core circuit network. A positive 400 and a negative 410 component of the combined in-phase and quadrature input signal is transmitted into the output offset canceled preamplifier 430. The signals are then routed to the input offset canceled preamplifier 400 via capacitors. A biasing circuit 420 generates two nominally identical voltages for the tail current sources of the two preamplifiers. The biasing circuit helps to reduce cross talk between the preamplifiers. The input offset canceled preamplifier's 440 output is transmitted to the regeneration latch 450 and then to the set-reset latch 460 to produce a positive and negative 470, 480 digital output for the core circuit network.

Figure 5:
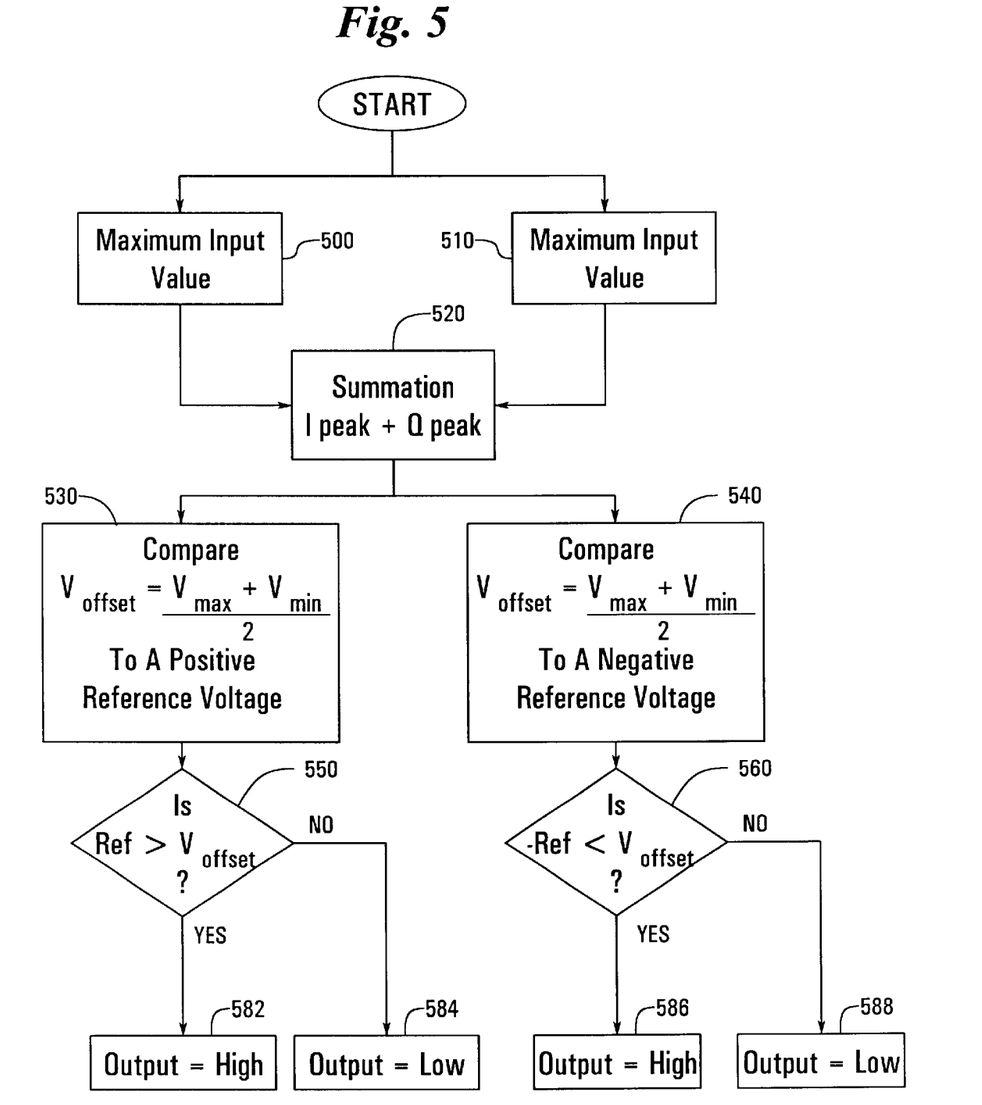
FIG. 5 is a flow diagram illustrating a general signal transition through the offset window detector.

FIG. 5 is a flow diagram illustrating a general signal transition thought the offset window detector. The maximum input signal 500 and the minimum input signal 510 are input into the comparator circuits. The addition 520 of maximum input signal 500 and the minimum input signal 510 are compared to the reference voltage Ref 530 and to –Ref 540. If the Ref 550 is greater than the sum of the maximum input signal 500 and the minimum input signal 510, the resulting output signal is high, otherwise the resulting output signal is low. If the –Ref 560 is less than the sum of the maximum input signal 500 and the minimum input signal 510, the resulting output signal is high, otherwise the resulting output signal is low.

Figure 6:
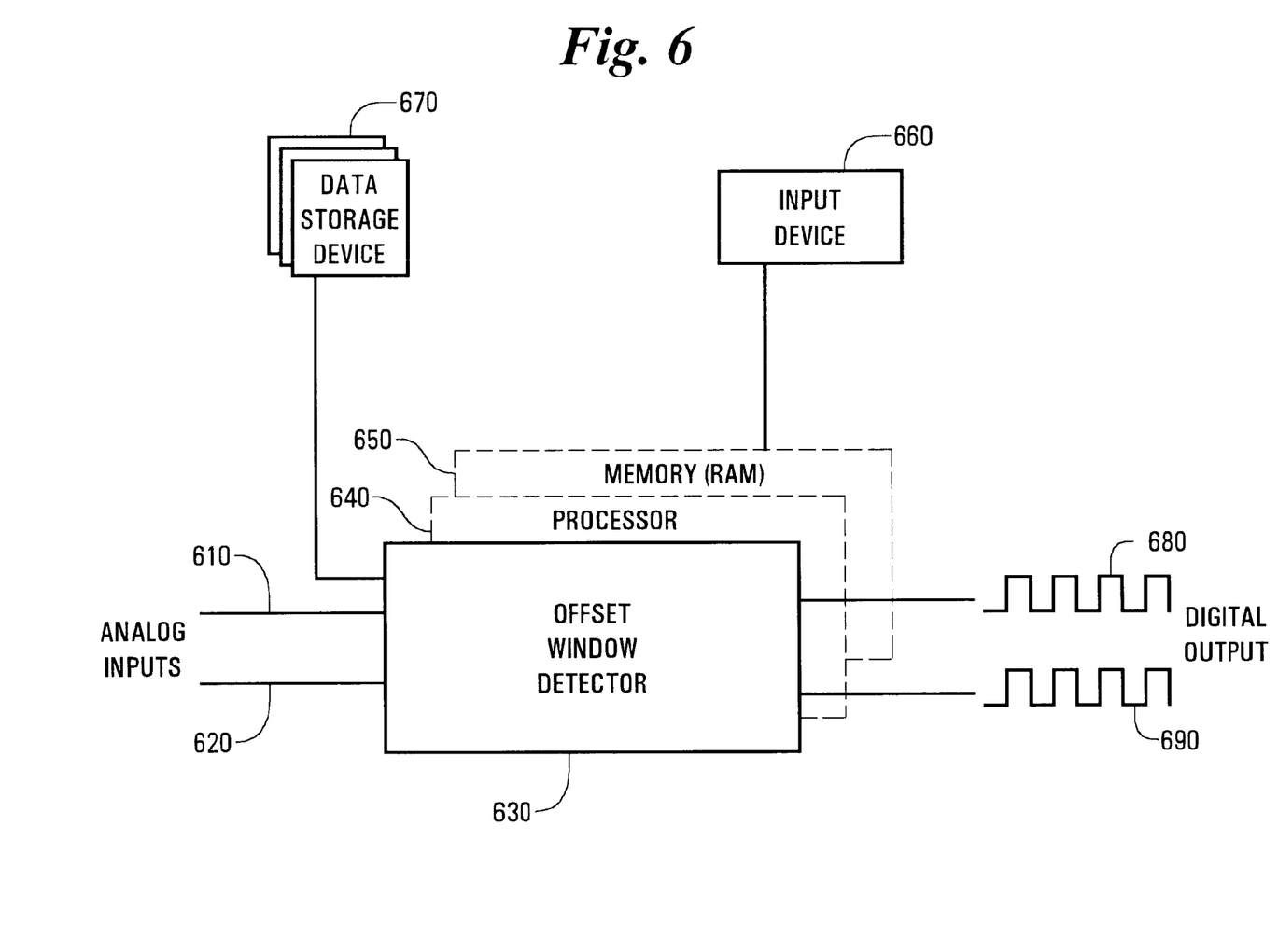
FIG. 6 is an exemplary hardware environment for the offset window detector.

Referring to FIG. 6, another exemplary hardware environment for comparing multiple signals from a sources shown according to the present invention. The present invention may be implemented using an offset window detector 630, comprised of a processor 640 and memory (RAM) 650. It is envisioned that attached to the detector 630 may be a memory device 650. Also included in this embodiment may be input devices 660, for downloading data and commands.

The detector 630 may operate under the control of an operating system. The detector 630 executes one or more computer programs under the control of the operating system.

Generally, the operating system and the detector programs may be tangibly embodied in a computer-readable medium or carrier, e.g. one or more of the fixed or removable data storage devices 670, or other data storage or data communications devices. Both operating system and the computer programs may be loaded from the data storage devices into the memory 650 of the detector 630 for execution by the processor 640. Those skilled in the art will recognize that the memory 650 is optional, or may be a memory device embedded or otherwise couple to the offset detector 630. Both the operating system and the detector programs comprise instructions which, when read and executed by the processor 640, cause the detector to perform the steps necessary to execute the steps or elements of the present invention.

Although one detector system configuration is illustrated in FIG. 6, those skilled in the art will recognize that any number of different configurations performing similar functions may be used in accordance with the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of comparing multiple signals from a source, comprising the steps of:
   providing a maximum peak value input signal and a minimum peak value input signal;
   comparing the input signals to a reference voltage using a first comparator to produce a first output signal; and
   comparing the input signals to the reference voltage using a second: comparator to produce a second output signal;
   wherein the first and the second output signal indicates whether the input signals are within a reference window defined by the reference voltage.

2. The method of claim 1 further comprising the step of summing values of the input signals.

3. The method of claim 2, wherein summing values of the input signals results in a cumulative value.

4. The method of claim 2, wherein the summing values of input signals further comprises summing an in-phase minimum value with an in-phase maximum value and a quadrature minimum value with a quadrature maximum value.

5. The method of claim 2, wherein the summing values of the maximum and minimum peak value input signals further comprises sampling the input signals.

6. The method of claim 5, wherein the sampling the input signals further comprises adding and subtracting the minimum peak value input signal and the maximum peak value input signal to provide a polarity of a resulting signal.

7. The method of claim 6, wherein subtracting the minimum peak value input signal and the maximum peak value input signal further comprises reversing the polarity of positive and negative components of the input signals.

8. The method of claim 5, wherein the sampling the input signals further comprising the step of generating two nominally identical voltages for a first preamplifier and a second preamplifier to reduce cross talk between said fire preamplifier and said second preamplifier.

9. The method of claim 1 further comprising a step of providing the reference voltage.

10. The method of claim 9, wherein the step of providing the reference voltage further comprises the step of generating said reference voltage from a signal generator.

11. The method of claim 9, wherein the step of providing the reference voltage further comprises the step of providing a control signal to regulate the reference voltage wherein the control signal varies an offset hysteresis window.

12. A detector circuit for comparing multiple signals from a source, comprising:
a means for generating a maximum peak value output signal and a minimum peak value output signal from an input signal;
a first comparator circuit for comparing the output signals to a reference voltage to produce a first compared output signal; and
a second comparator circuit for comparing the output signals to the reference voltage to produce a second compared output signal;
wherein the first and the second compared output signals indicate whether the input signal is within a reference window defined by the reference voltage.

13. The detector circuit of claim 12, wherein the fist and second comparator circuit further sums the values of the output signals.

14. The detector circuit of claim 13, wherein summing values of the output signals results in a cumulative value.

15. The detector circuit of claim 13, wherein me comparator circuit sums an in-phase minimum value with an in-phase maximum value and a quadrature minimum value with a quadrature maximum value of said output signals.

16. The detector circuit of claim 13, wherein the comparator circuit comprises a sampling circuit for sampling the output signals.

17. The detector circuit of claim 16, wherein the sampling circuit adds and subtracts the output signals to determine a polarity of a resulting signal.

18. The detector circuit of claim 17, wherein subtracting the output signals comprises reversing a polarity of an output signal.

19. The detector circuit of claim 16, wherein the sampling circuit comprises an output offset cancelled preamplifier and an input offset cancelled preamplifier for the cancellation of an output offset voltage.

20. The detector circuit of claim 19, wherein the sampling circuit further comprises a regeneration latch.

21. The detector circuit of claim 20, wherein the sampling circuit further comprises a set-reset latch, coupled to the regeneration latch.

22. The detector circuit of claim 19, wherein the sampling circuit further comprises a biasing circuit, coupled to the output offset cancelled preamplifier and the input offset cancelled preamplifier, for generating two nominally identical voltages to reduce cross talk in a preamplifier output signal.

23. The detector circuit of claim 22, wherein the generating two nominally identical voltages further comprises a tail current source for the output offset canceled preamplifier and the input offset canceled preamplifier.

24. The detector circuit of claim 12 further comprising a reference voltage generator, coupled to the first and the second comparator circuits, for supplying the reference voltage.

25. The detector circuit of claim 24, wherein the reference voltage generator further comprises a control signal to regulate the reference voltage, wherein the control signal varies a hysteresis window.

26. A system for comparing multiple signals from a source, comprising:
an antenna to receive the propagated signal;
a peak detector, coupled to the antenna, for receiving the received signal and generating a maximum peak value output signal and a minimum peak value output signal;
a window detector, coupled to the peak detector, for comparing the output signals with a reference voltage, wherein the window detector comprises:
a first comparator circuit for comparing the output signals to the reference voltage to produce a first compared output signal; and
a second comparator circuit for comparing the output signals to the reference voltage to produce a second compared output signal;
wherein the first and the second compared output signals indicate whether the output signals are within a reference window defined by the reference voltage.

27. The system of claim 26, wherein the fist and the second comparator circuit farther sum the values of the maximum and minimum peak values of the output signals.

28. The system of claim 27, wherein g values of the output signals results in a cumulative value.

29. The system of claim 27, wherein summing values of the output signals further comprises summing an in-phase minimum peak value and an in-phase maximum peak value and a quadrature minimum peak value and a quadrature maximum peak value.

30. The system of claim 26, further comprising a sampling circuit for adding and subtracting the output signals to provide a polarity of a resulting signal.

31. The system of claim 30, wherein subtracting the output signals comprises reversing a polarity of a positive and a negative component of the output signals.

32. The system of claim 30, wherein the sampling circuit comprises an output offset cancelled preamplifier and an input offset cancelled preamplifier for the cancellation of an output offset voltage.

33. The system of claim 30, wherein the sampling circuit comprises a regeneration latch.

34. The system of claim 30, wherein the sampling circuit comprises a setreset latch, coupled to the regeneration latch.

35. The system of claim 32, wherein the input sampling circuit comprises a biasing circuit, coupled to the output offset cancelled preamplifier and the input offset cancelled preamplifier, for generating two nominally identical voltages to reduce cross talk in a preamplifier output signal.

36. The system of claim 35, wherein the generating two nominally identical voltages further comprises a tail current source for the output offset canceled preamplifier and the input offset canceled preamplifier.

37. The system of claim 26 further comprising a reference voltage generator for supplying the reference voltage.

38. The system of claim 37, wherein the reference voltage generator further comprises a control signal to regulate the reference voltage wherein the control signal varies a hysteresis window.

39. An apparatus for providing offset window detection, the apparatus comprising a data storage device comprising instructions; and a detector circuit coupled to said data storage device, said detector comprising:
a means for generating a maximum peak value output signal and a minimum peak value output signal from an input signal;
a first comparator circuit for comparing the maximum peak value output signal to a reference voltage to produce a first compared output signal; and
a second comparator circuit for comparing the minimum peak value output signal to the reference voltage to produce a second compared output signal;
wherein the first and the second compared output signals indicate whether the input signal is within a reference window defined by the reference voltage.

* * * * *

UNITED STATES PATENT AND TRADEMARK OFFICE
CERTIFICATE OF CORRECTION

PATENT NO. : 6,469,547 B1
DATED : October 22, 2002
INVENTOR(S) : Rabii

It is certified that error appears in the above-identified patent and that said Letters Patent is hereby corrected as shown below:

Column 6,
Line 35, "a second: comparator" should read -- a second comparator --
Line 61, "fire" should read -- first --

Column 7,
Line 23, "me" should read -- the --

Column 8,
Line 13, "fist" should read -- first --
Line 14, "farther" should read -- further --
Line 16, "g" should read -- summing --
Line 35, "setreset" should read -- set-reset --

Signed and Sealed this

Twenty-second Day of July, 2003

JAMES E. ROGAN
*Director of the United States Patent and Trademark Office*